US011228021B2

(12) United States Patent
Noh et al.

(10) Patent No.: US 11,228,021 B2
(45) Date of Patent: Jan. 18, 2022

(54) DISPLAY PANEL AND DEVICE INCLUDING PROTRUDING END OVERLAPPING ENDS OF ORGANIC LAYER AND POLARIZING PLATE

(71) Applicant: SAMSUNG DISPLAY CO., LTD., Yongin-si (KR)

(72) Inventors: Dongsoup Noh, Yongin-si (KR); Inchan Kim, Yongin-si (KR); Jinho Kim, Yongin-si (KR); Wonho Jang, Yongin-si (KR); Jae Young Jang, Yongin-si (KR); Sung-Hwan Cho, Yongin-si (KR); Gil Jae Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 272 days.

(21) Appl. No.: 16/527,794

(22) Filed: Jul. 31, 2019

(65) Prior Publication Data

US 2020/0127229 A1 Apr. 23, 2020

(30) Foreign Application Priority Data

Oct. 18, 2018 (KR) ........................ 10-2018-0124270

(51) Int. Cl.
*H01L 51/52* (2006.01)
*H01L 51/56* (2006.01)
*H01L 51/00* (2006.01)
*H01L 27/32* (2006.01)

(52) U.S. Cl.
CPC ...... *H01L 51/5253* (2013.01); *H01L 51/5281* (2013.01); *H01L 51/56* (2013.01); *H01L 27/3276* (2013.01); *H01L 51/0097* (2013.01)

(58) Field of Classification Search
CPC ............ H01L 51/5253; H01L 51/5281; H01L 51/5293; H01L 51/56
See application file for complete search history.

(56) References Cited

U.S. PATENT DOCUMENTS

| 9,970,138 B2 | 5/2018 | Linnet et al. |
| 9,971,182 B2 | 5/2018 | Zhou et al. |
| 9,978,997 B2 | 5/2018 | Kwon et al. |
| 2019/0326371 A1* | 10/2019 | Cao ..................... H01L 27/3246 |

FOREIGN PATENT DOCUMENTS

| KR | 10-2014-0141165 A | 12/2014 |
| KR | 10-2016-0035659 A | 4/2016 |
| KR | 10-2016-0072371 A | 6/2016 |

* cited by examiner

*Primary Examiner* — Matthew E. Gordon
(74) *Attorney, Agent, or Firm* — Kile Park Reed & Houtteman PLLC

(57) ABSTRACT

A display device includes a display panel including a first area and a second area, a first end of the display panel being in the first area and a second end of the display panel being in the second area, wherein the second area extends away from the first area in a first direction, and the second end of the display panel protrudes from the first end of the display panel 1 in a second direction perpendicular to the first direction. a polarizing plate on the display panel, a first end of the polarizing plate being located in the first area overlapping the first end of the display panel in a plan view and an organic layer on the display panel in the second area, the organic layer extending away from the polarizing plate in the second direction, an end of the organic layer overlapping the second end of the display panel in a plan view.

10 Claims, 10 Drawing Sheets

DISPLAY PANEL AND DEVICE INCLUDING PROTRUDING END OVERLAPPING ENDS OF ORGANIC LAYER AND POLARIZING PLATE

CROSS-REFERENCE TO RELATED APPLICATION

Korean Patent Application No. 10-2018-0124270, filed on Oct. 18, 2018, in the Korean Intellectual Property Office, and entitled: "Display Device and Method of Manufacturing the Same," is incorporated by reference herein in its entirety.

BACKGROUND

1. Field

Embodiments relate to a display device. More particularly, embodiments relate to a display device and a method of manufacturing the display device.

2. Description of the Related Art

A market of a display device that is a medium between a user and information has been growing with development of information technology. The display devices are developed in various way. Among the display devices, an organic light emitting display device has been attracting attention due to its advantages such as a slim thickness, a light weight, and a low power consumption.

SUMMARY

Embodiments are directed to a display device including a display panel including a first area and a second area, a first end of the display panel being in the first area and a second end of the display panel being in the second area, wherein the second area extends away from the first area in a first direction, and the second end of the display panel protrudes from the first end of the display panel in a second direction perpendicular to the first direction, a polarizing plate on the display panel, a first end of the polarizing plate being located in the first area overlapping the first end of the display panel in a plan view and an organic layer on the display panel in the second area, the organic layer extending away from the polarizing plate in the second direction, an end of the organic layer overlapping the second end of the display panel in a plan view.

The organic layer may contact a second end of the polarizing plate located in the second area.

The second end of the polarizing plate may protrude in the second direction from the first end of the polarizing plate.

The display panel may further include a third area extending in the first direction away from the second area. A third end of the display panel may be the third area. The third end of the display panel may protrude in the second direction from the second end of the display panel.

A third end of the polarizing plate located in the third area may be aligned in a plan view with a second end of the polarizing plate located in second area.

The display device may further include a bending protection layer on the display panel in the third area, the bending protection layer extending in the second direction away from the polarizing plate.

The organic layer may be integrally formed with the bending protection layer.

The display device may further include a watertight member contacting the first end of the display panel and the first end of the polarizing plate.

The display device may further include a transparent adhesive layer on the polarizing plate and a cover window on the transparent adhesive layer.

The watertight member may contact an end of the transparent adhesive layer.

Embodiments are also directed to a method of manufacturing a display device, including providing a display panel including a first area and a second area, the second area extending in a first direction away from the first area, attaching a polarizing plate to the display panel, forming an organic layer on the display panel, the organic layer extending away from the polarizing plate in a second direction perpendicular to the first direction, and simultaneously cutting the display panel and the polarizing plate in the first area and simultaneously cutting the display panel and the organic layer in the second area along a cutting line defined in the first area and the second area.

An end of the display panel and an end of the polarizing plate cut in the first area may overlap with each other in a plan view.

An end of the display panel and an end of the organic layer cut in the second area may overlap with each other in a plan view.

The cutting line defined in the second area may be spaced in the second direction away from the cutting line defined in the first area.

A boundary between the polarizing plate and the organic layer may be parallel with the first direction.

The cutting line defined in the first area may be spaced in a third direction opposite to the second direction away from the boundary between the polarizing plate and the organic layer. The cutting line defined in the second area may be spaced in the second direction away from the boundary between the polarizing plate and the organic layer.

The method may include cutting the display panel, the polarizing plate, and the organic layer using a laser.

The display panel may further include a third area extending away from the second area in the first direction. The cutting line may further extend between the second area and the third area. The method may further include simultaneously cutting the display panel and the organic layer along the cutting line further defined between the second area and the third area.

The method may further include forming a watertight member to contact an end of the display panel and an end of the polarizing plate cut in the first area after simultaneously cutting the display panel and the polarizing plate and simultaneously cutting the display panel and the organic layer along the cutting line.

The method may further include, after simultaneously cutting the display panel and the polarizing plate and simultaneously cutting the display panel and the organic layer along the cutting line, attaching a transparent adhesive layer to the polarizing plate; and attaching a cover window to the transparent adhesive layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
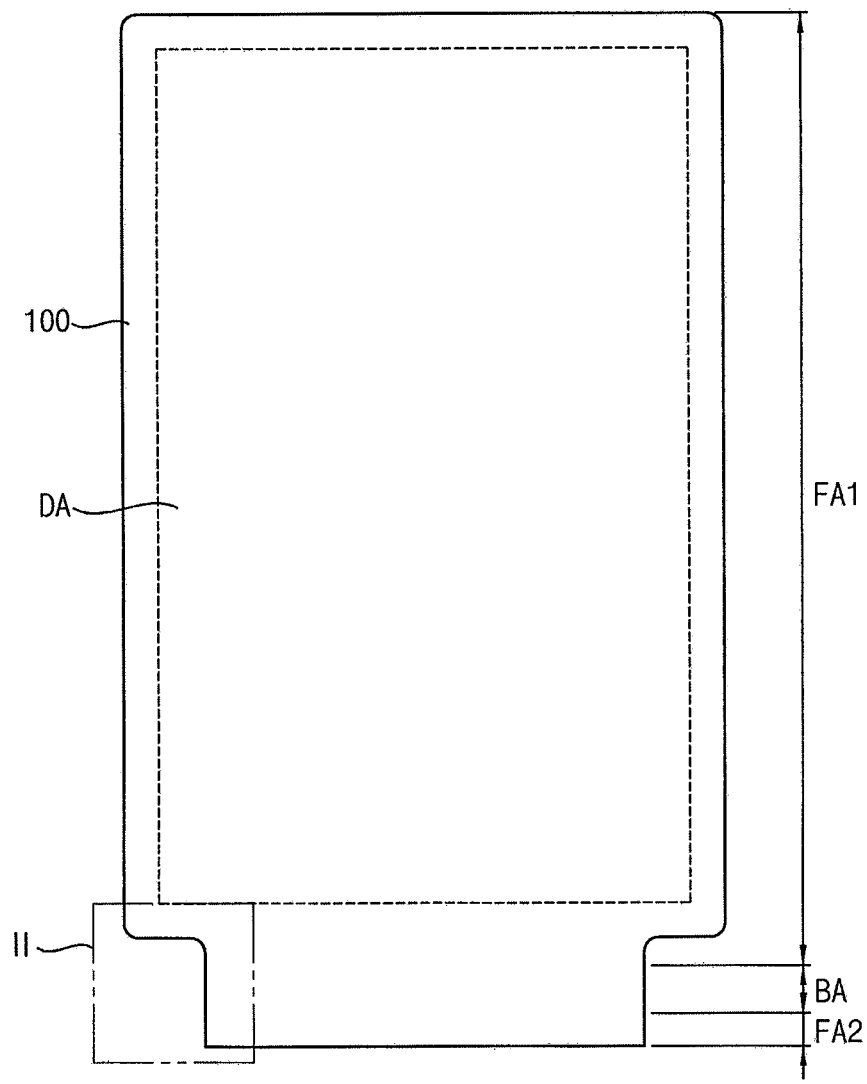
FIG. 1 illustrates a plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, a display device according to an embodiment will be described with reference to FIGS. 1 to 6.

Figure 2:
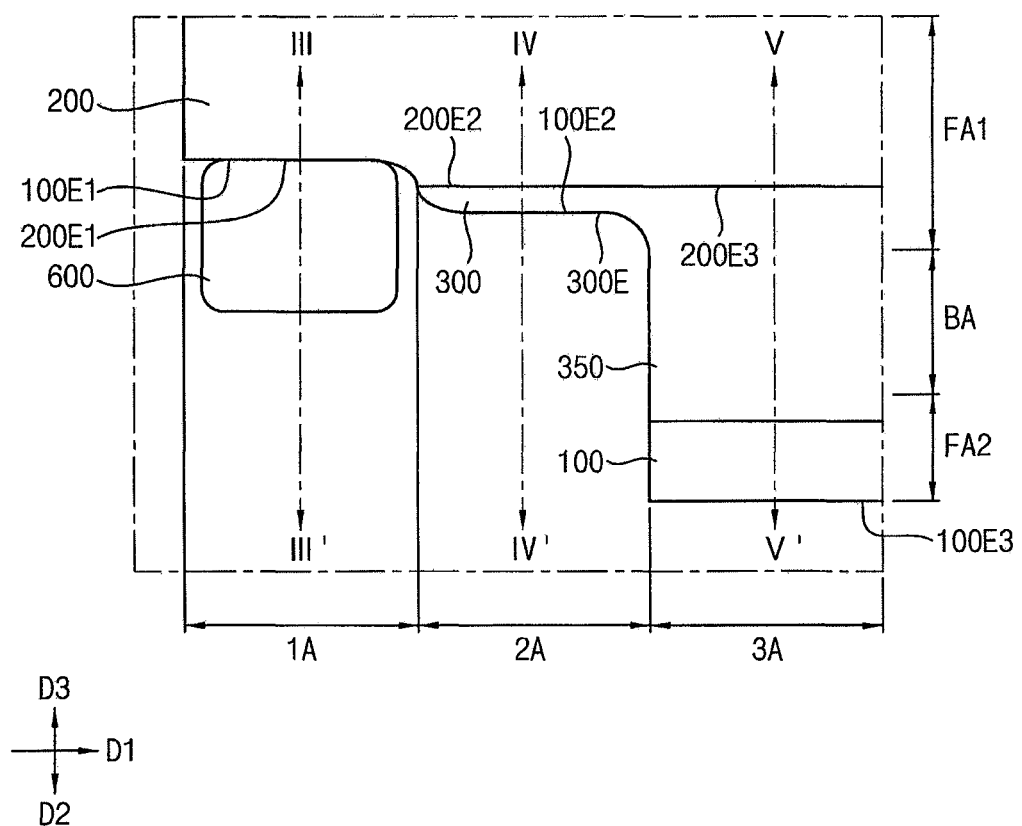
FIG. 2 illustrates a plan view of a portion of the display device in FIG. 1.
Figure 3:
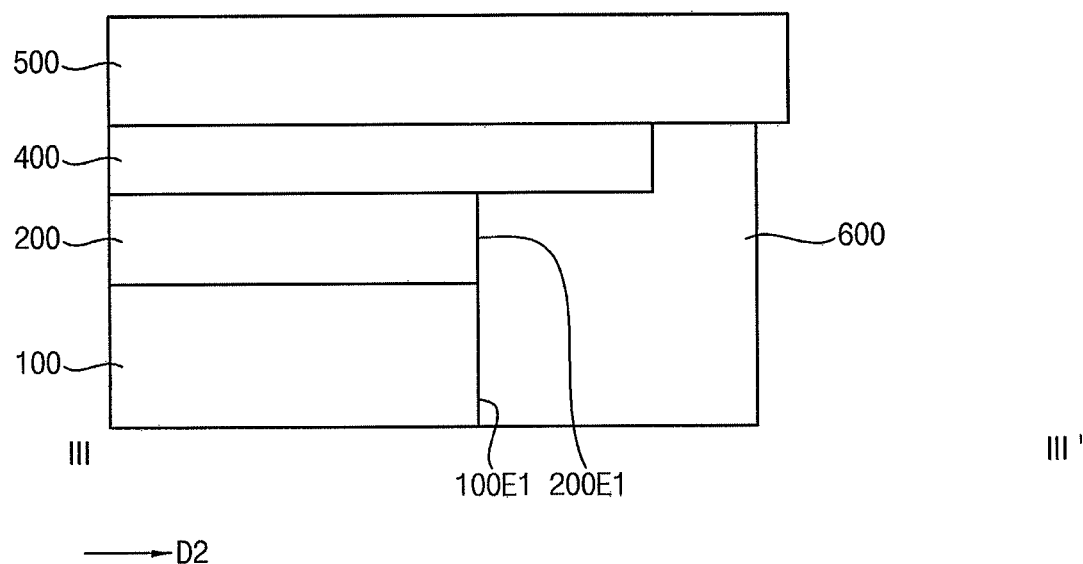
FIG. 3 illustrates a cross-sectional view of a first area of the display device in FIG. 2.
Figure 4:
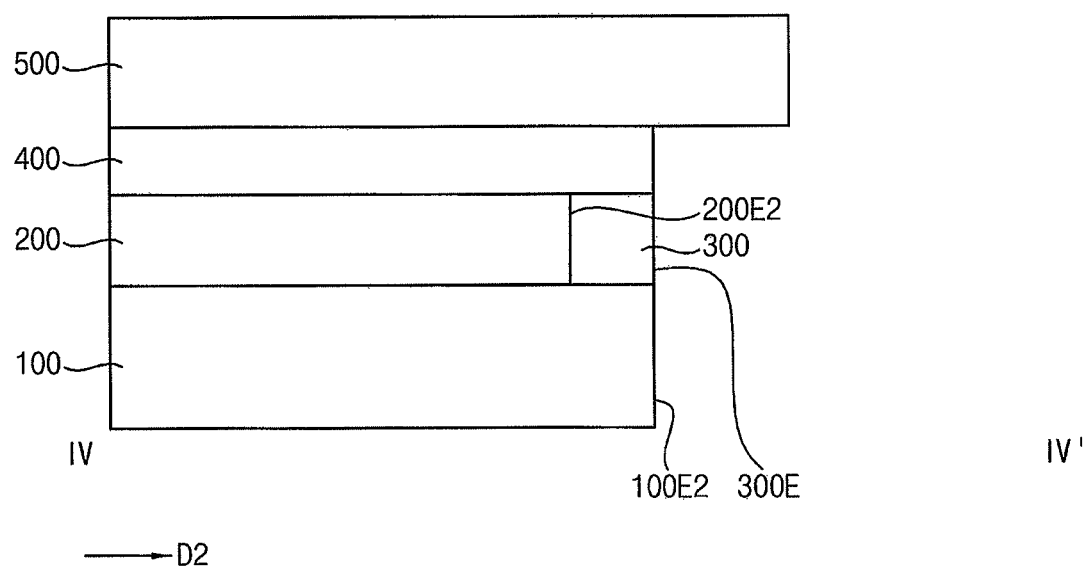
FIG. 4 illustrates a cross-sectional view of a second area of the display device in FIG. 2.
Figure 5:
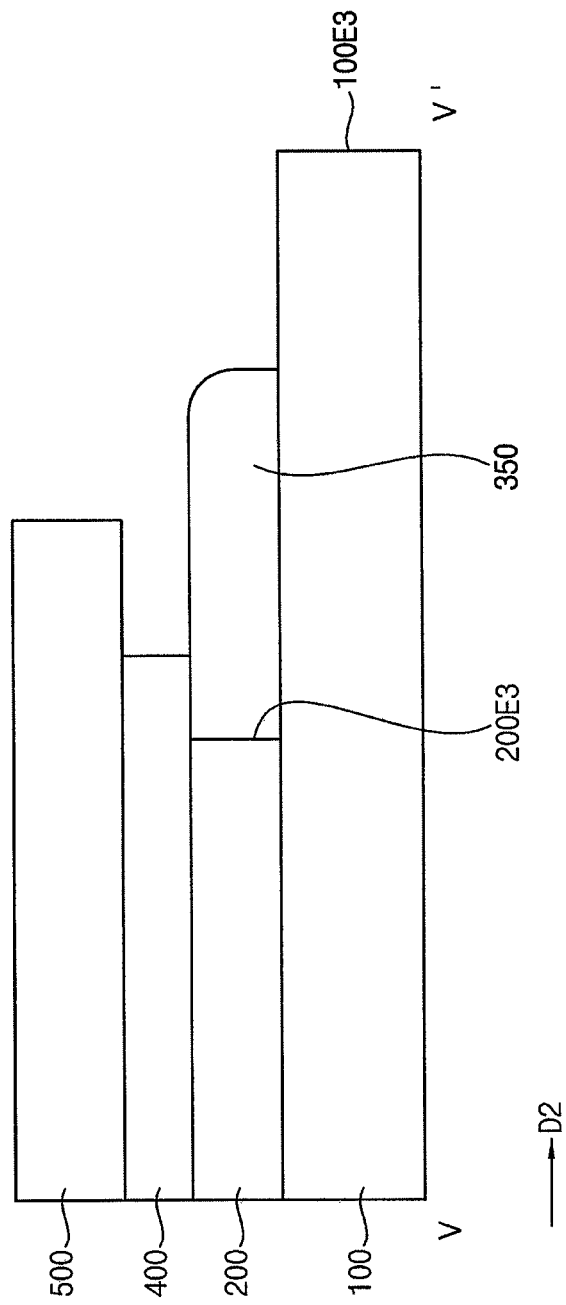
FIG. 5 illustrates a cross-sectional view of a third area of the display device in FIG. 2.

FIG. 1 illustrates a plan view of a display device according to an embodiment. FIG. 2 illustrates a plan view of a portion of the display device in FIG. 1. FIG. 3 illustrates a cross-sectional view of a first area of the display device in FIG. 2. FIG. 4 illustrates a cross-sectional view of a second area of the display device in FIG. 2. FIG. 5 illustrates a cross-sectional view of a third area of the display device in FIG. 2. For example, FIG. 2 illustrates a plan view of an area II in FIG. 1, FIG. 3 illustrates a cross-sectional view taken along a line in FIG. 2, FIG. 4 illustrates a cross-sectional view taken along a line IV-IV' in FIG. 2, and FIG. 5 illustrates a cross-sectional view taken along a line V-V' in FIG. 2.

Referring to FIGS. 1, 2, 3, 4, and 5, a display device according to an embodiment may include a display panel 100, a polarizing plate 200, and an organic layer 300. In an embodiment, the display device may further include a bending protection layer 350, a transparent adhesive layer 400, a cover window 500, and a watertight member 600.

The display devices may be of various types. For example, the display device may be one of a liquid crystal display device, an electrophoretic display device, an organic light emitting display device, an inorganic light emitting display device, a field emission display device, a surface-conduction electron-emitter display device, a plasma display device, etc. Hereinafter, the organic light emitting display device may be used as an example of the display device according to an embodiment.

The display panel 100 may include a first flat area FA1, a bending area BA, and a second flat area FA2. The first flat area FA1, the bending area FA, and the second flat area FA2 may extend along a first direction D1. The second flat area FA2 may be spaced apart from the first flat area FA1 in a second direction D2 perpendicular to the first direction D1. The bending area BA may be located between the first flat area FA1 and the second flat area FA2. The first flat area FA1 may include a display area DA for displaying an image. In an embodiment, the bending area BA may be spaced apart from the display area DA.

The display panel 100 may be bent in the bending area BA. The display panel 100 may be bent along a bending axis extending along the first direction D1. The bending axis may be provided inside the bending area BA. Here, the term "bent" does not mean a fixed shape but indicates a shape deformable into another shape from an original shape. The term "bent" includes a shape that is folded, curved, or rolled along one or more axis, i.e. one or more bending axis. In an embodiment, the display device may be bent such that surfaces of the two flat areas FA1 and FA2 are located in parallel to each other. In some implementations, the display device may be bent such that surfaces of the two flat areas FA1 and FA2 form an angle (e.g., a predetermined angle) (e.g., an acute angle, a right angle, or an obtuse angle) with the bending area BA interposed therebetween.

The display panel 100 may include a first area 1A, a second area 2A, and a third area 3A. The first area 1A, the second area 2A, and the third area 3A may extend away from the display area DA in the second direction D2. Each of the first area 1A, the second area 2A, and the third area 3A may extend along the second direction D2. The second area 2A may extend away from the first area 1A in the first direction D1, and the third area 3A may extend away from the second area 2A in the first direction D1.

The display panel 100 may have a first end 100E1 located in the first area 1A, a second end 100E2 located in the second area 2A, and a third end 100E3 located in the third area 3A. The first end 100E1 of the display panel 100 may extend away from an inside of the display panel 100 in the second direction D2. The first end 100E1 may be substantially parallel with the first direction D1.

The second end 100E2 of the display panel 100 may extend from the inside of the display panel 100 in the second direction D2. The second end 100E2 of the display panel 100 may protrude in the second direction D2 from the first end 100E1 of the display panel 100. The second end 100E2 of the display panel 100 may extend from the first end 100E1 of the display panel 100 and may be substantially parallel with the first direction D1. The third end 100E3 of the display panel 100 may extend from the inside of the display panel 100 in the second direction D2. The third end 100E3 of the display panel 100 may protrude in the second direction D2 from the second end 100E2 of the display panel 100. The third end 100E3 of the display panel 100 may extend from the second end 100E2 of the display panel 100 and may be substantially parallel with the first direction D1.

The polarizing plate 200 may be disposed on the display panel 100. For example, the polarizing plate 200 may be disposed on the first flat area FA1 of the display panel 100 including the display area DA. The polarizing plate 200 may reduce reflection of an external light. For example, when an external light ray that has passed through the polarizing plate 200 is reflected from an upper portion of the display panel 100 and then passes through the polarizing plate 200 again, a phase of the reflected external light may be changed as the incoming external light passes through the polarizing plate 200 twice. As a result, a phase of reflected external light may be different from the phase of the incoming external light entering the polarizing plate 200 to the extent that a destructive interference occurs. Accordingly, the reflection of external light may be reduced to increase visibility of the display device.

The polarizing plate 200 may have a first end 200E1 located in the first area 1A, a second end 200E2 located in the second area 2A, and a third end 200E3 located in the third area 3A. The first end 200E1 of the polarizing plate 200 may extend in the second direction D2 from an inside of the polarizing plate 200 and may be substantially parallel with the first direction D1. The first end 200E1 of the polarizing plate 200 may overlap the first end 100E1 of the display panel 100 in a plan view. For example, a tolerance between the first end 100E1 of the display panel 100 and the first end 200E1 of the polarizing plate 200 may be substantially zero. The tolerance may be defined as a distance between the first end 100E1 of the display panel 100 and the first end 200E1 of the polarizing plate 200 in a plan view. The first end 200E1 of the polarizing plate 200 and the first end 100E1 of the display panel 100 may overlap with each other in a plan view. Permeation of moisture through the first area 1A of the display panel 100 may be minimized or prevented.

The second end 200E2 of the polarizing plate 200 may extend from the inside of the polarizing plate 200 in the second direction D2. The second end 200E2 of the polarizing plate 200 may protrude in the second direction D2 from the first end 200E1 of the polarizing plate 200. The second end 200E2 of the polarizing plate 200 may extend from the first end 200E1 of the polarizing plate 200, and may be substantially parallel with the first direction D1. The second end 200E2 of the polarizing plate 200 may extend in a third direction D3 opposite to the second direction D2 from the second end 100E2 of the display panel 100 in a plan view.

The third end 200E3 of the polarizing plate 200 may extend in the second direction D2 from the inside of the polarizing plate 200. The third end 200E3 of the polarizing plate 200 may align with the second end 200E2 of the polarizing plate 200 in a plan view. The third end 200E3 of the polarizing plate 200 may extend from the second end 200E2 of the polarizing plate 200 and may be substantially parallel with the first direction D1.

The organic layer 300 may be disposed on the display panel 100 in the second area 2A. The organic layer 300 may extend in the second direction D2 from the polarizing plate 200. The organic layer 300 may contact the second end 200E2 of the polarizing plate 200 located in the second area 2A. The organic layer 300 may cover a portion of the display panel 100 in the second area 2A on which the polarizing plate 200 is not disposed. The organic layer 300 may prevent or minimize an exposure of an upper surface of the display panel 100 in the second area 2A.

The organic layer 300 may include an organic material such as polyimide, epoxy based resin, acryl based resin, polyester, photoresist, polyacrylate resin, polyimide based resin, polyamide based resin, siloxane based resin, or the like. In an embodiment, the organic layer 300 may further include an elastic material such as silicon, urethane, thermoplastic polyurethane, or the like.

The organic layer 300 may have an end 300E extending in the second direction D2 from an inside of the organic layer 300. The end 300E of the organic layer 300 may be substantially in parallel with the first direction D1. The end 300E of the organic layer 300 may overlap the second end 100E2 of the display panel 100 in a plan view. A tolerance between the second end 100E2 of the display panel 100 and the end 300E of the organic layer 300 may be substantially zero. The tolerance may be defined as a distance between the second end 100E2 of the display panel 100 and the end 300E of the organic layer 300 in a plan view.

The bending protection layer 350 may be disposed on the display panel 100 in the third area 3A. The bending protection layer 350 may cover an entirety of the bending area BA of the display panel 100 and may cover a portion of the first flat area FA1 and a portion of the second flat area FA2 adjacent to the bending area BA. The bending protection layer 350 may extend in the second direction D2 from the polarizing plate 200. The bending protection layer 350 may contact the third end 200E3 of the polarizing plate 200 located in the third area 3A.

When a stack structure is bent, there is a stress neutral plane in the stack structure. If the bending protection layer 350 were not present, an excessive tensile stress to a conductive layer in the bending area BA could be applied when the display panel 100 is bent when the conductive layer is not in the stress neutral plane. However, when the bending protection layer 350 is formed in the bending area BA, and a thickness and a modulus of the bending protection layer 350 is controlled such that the location of the stress neutral plane in the stack structure including the display panel 100, the bending protection layer 350, etc. may be adjusted. The location of the stress neutral plane may be located to be around the conductive layer by forming the bending protection layer 350. Accordingly, a tensile stress applied to the conductive layer may be minimized or reduced.

The bending protection layer 350 may include an organic material such as polyimide, epoxy based resin, acryl based resin, polyester, photoresist, polyacrylate resin, polyimide based resin, polyamide based resin, siloxane based resin, or the like. In an embodiment, the bending protection layer 350 may further include an elastic material such as silicon, urethane, thermoplastic polyurethane, or the like.

In an embodiment, the organic layer 300 may be integrally formed with the bending protection layer 350. In this case, the organic layer 300 and the bending protection layer 350 may include the same material.

The transparent adhesive layer 400 may be disposed on the polarizing plate 200, and the cover window 500 may be disposed on the transparent adhesive layer 400. The transparent adhesive layer 400 may adhere the cover window 500 to the polarizing plate 200. The transparent adhesive layer 400 may include a transparent adhesive, a pressure sensitive adhesive, etc. The cover window 500 may protect the display panel 100 from being broken by impact from the outside.

The watertight member 600 may be in contact with the first end 100E1 of the display panel 100 and the first end 200E1 of the polarizing plate 200, which are located in the first area 1A. The watertight member 600 may seal the first end 100E1 of the display panel 100 and the first end 200E1 of the polarizing plate 200 such that permeation of moisture into the display panel 100 may be prevented or minimized. In an embodiment, the watertight member 600 may contact an end of the transparent adhesive layer 400.

Figure 6:
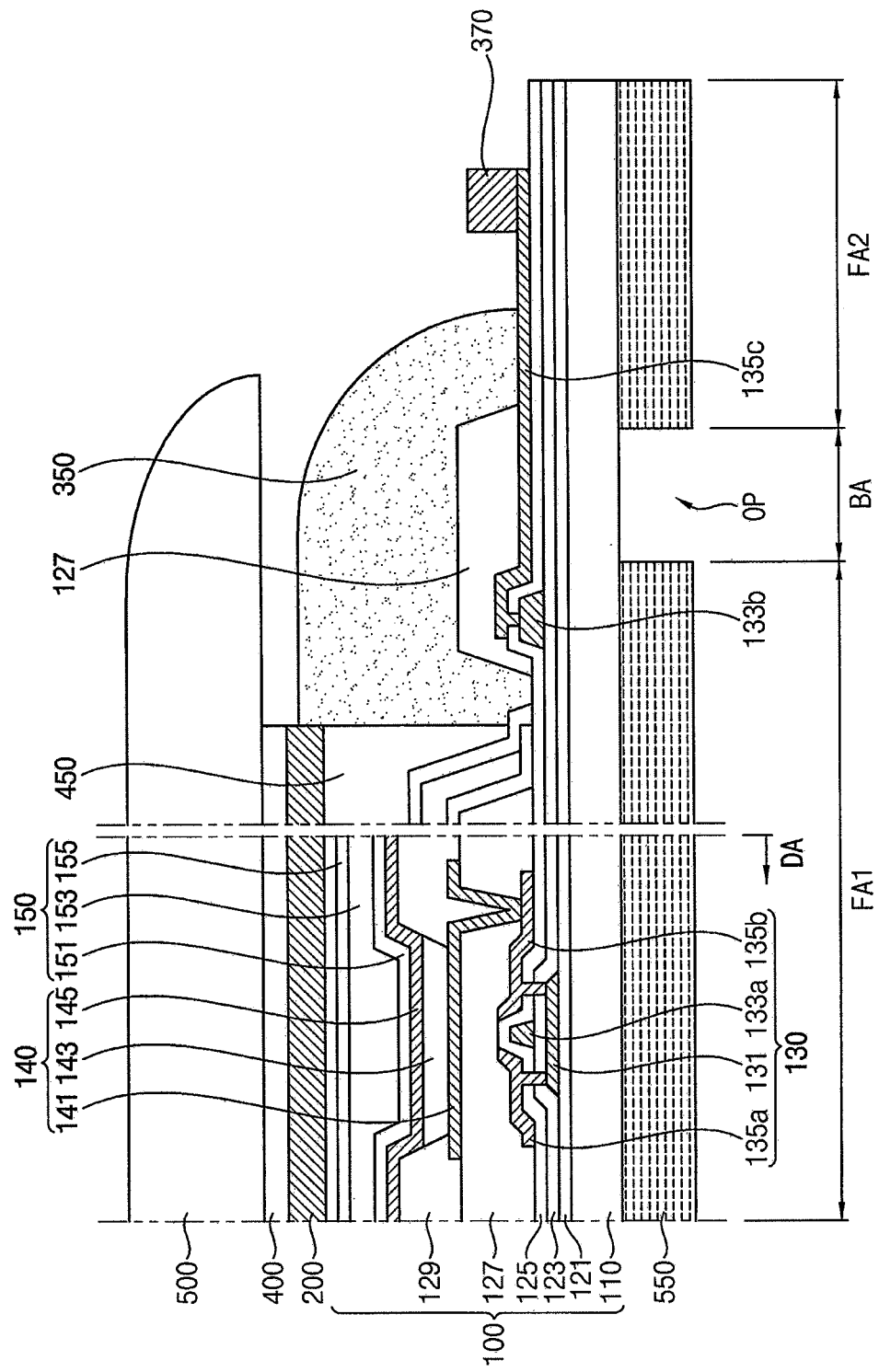
FIG. 6 illustrates a cross-sectional view illustrating the display device in FIG. 5 in detail.

FIG. 6 illustrates a cross-sectional view of the display device in FIG. 5 in detail.

Referring to FIG. 6, the display panel 100 may include a substrate 110, insulation layers 121, 123, 125, 127, and 129, a thin film transistor 130, an organic light emitting element 140, an encapsulation layer 150, or the like.

The first flat area FA1 of the display panel 100 may include the display area DA. The first flat area FA1 may further include a portion of a non-display area outside the display area DA as illustrated in FIG. 6. The second flat area FA2 and the bending area BA may also include the non-display area.

A plurality of pixels may be disposed in the display area DA of the display panel 100, such that the display panel 100 may display an image. A switching element such as the thin film transistor 130, a display element such as the organic light emitting element 140, etc. may be provided in the display area DA. Signal lines such as a gate line for transmitting a gate signal, a data line for transmitting a data signal, a driving voltage line and a common voltage line for transmitting power voltages, etc. may be further provided in the display area DA. An electrical combination of the thin film transistor 130 electrically connected to the gate line, the data line and the driving voltage line, the organic light emitting element 140 electrically connected to the common voltage line, etc. may form the pixel thereby displaying an image. The pixel may emit light having a luminance corresponding to a driving current passing through the organic light emitting element 140 based on the data signal according to the driving voltage and the common voltage applied to the pixel.

The substrate 110 may include various flexible materials. For example, the substrate 110 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The thin film transistor 130 may include a semiconductor layer 131, a gate electrode 133a, a source electrode 135a, and a drain electrode 135b. In an embodiment, the semiconductor layer 131 may include amorphous silicon, polycrystalline silicon, an oxide semiconductor, or an organic semiconductor material.

The gate electrode 133a may be connected to the gate line for transferring on and off signals to the thin film transistor 130. The gate electrode 133a may include a low-resistive conductive material. For example, the gate electrode 133a may have a single-layer structure or a multi-layer structure including a conductive material including, for example, molybdenum (Mo), aluminum (Al), copper (Cu), titanium (Ti), or the like.

Each of the source electrode 135a and the drain electrode 135b may be a single-layer structure or a multi-layer structure including a conductive material having high conductivity. The source electrode 135a and the drain electrode 135b may be respectively connected to a source area and a drain area of the semiconductor layer 131. For example, each of the source electrode 135a and the drain electrode 135b may be a single-layer structure or a multi-layer structure including a conductive material such as, for example, Al, Cu, Ti, or the like.

To obtain an insulating property between the semiconductor layer 131 and the gate electrode 133a, a gate insulation layer 123 may be disposed between the semiconductor layer 131 and the gate electrode 133a. The gate insulation layer 123 may include an inorganic material, such as silicon oxide, silicon nitride, silicon oxynitride, or the like. Further, an insulation interlayer 125 including an inorganic material, such as silicon oxide, silicon nitride, silicon oxynitride, or the like, may be disposed on the gate electrode 133a. The source electrode 135a and the drain electrode 135b may be disposed on the insulation interlayer 125. The source electrode 135a and the drain electrode 135b may be connected to the semiconductor layer 131 via contact holes.

In an embodiment, a buffer layer 121 including an inorganic material, such as silicon oxide, silicon nitride, silicon oxynitride, or the like, may be interposed between the thin film transistor 130 and the substrate 110. The buffer layer 121 may increase the smoothness of an upper surface of the substrate 110. The buffer layer 121 may also serve to prevent, minimize, or reduce infiltration of impurities through the substrate 110, etc. into the semiconductor layer 131 of the thin film transistor 130.

A planarization layer 127 may be disposed on the thin film transistor 130. For example, when the organic light emitting element 140 is disposed on the thin film transistor 130 as shown in FIG. 6, the planarization layer 127 may cover the thin film transistor 130, providing a planarized surface for manufacturing the organic light emitting element 140 on the thin film transistor 130. The planarization layer 127 may be formed of an organic material. As shown in FIG. 6, the planarization layer 127 may have an opening outside the display area DA such that a portion of the planarization layer 127 within the display area DA and a portion of the planarization layer 127 outside the display area DA may be physically separated from each other by the opening. Thus, impurities from the planarization layer 127 may be prevented or substantially prevented from infiltrating the display area DA.

The organic light emitting element 140 including a pixel electrode 141, an opposite electrode 145, and an intermediate layer 143 interposed between the pixel electrode 141 and the opposite electrode 145 may be disposed on the planarization layer 127 in the display area DA. The intermediate layer 143 may include an emission layer. The pixel electrode 141 may be electrically connected to the thin film transistor 130 by contacting one of the source electrode 135a and the drain electrode 135b via an opening formed in the planarization layer 127.

A pixel defining layer 129 may be disposed on the planarization layer 127. The pixel defining layer 129 may have an opening corresponding to each pixel. For example, the opening of the pixel defining layer 129 may expose at least a center portion of the pixel electrode 141 to define the pixel. The pixel defining layer 129 may increase a distance between an edge of the pixel electrode 141 and the opposite electrode 145 above the pixel electrode 141 to prevent or substantially prevent an electric arc from being generated from an end portion of the pixel electrode 141. In an embodiment, the pixel defining layer 129 may be formed of an organic material.

In an embodiment, the intermediate layer 143 of the organic light emitting element 140 may include a low-molecular weight material or a polymer material. In an embodiment, when the intermediate layer 143 includes the low-molecular weight material, the intermediate layer 143 may have a single or multi-layered structure including a hole injection layer (HIL), a hole transport layer (HTL), an emission layer (EML), an electron transport layer (ETL), and an electron injection layer (EIL). The intermediate layer 143 may include any of various organic materials including copper phthalocyanine (CuPc), N,N'-di(naphthalene-1-yl)-N,N'-diphenyl-benzidine (NPB), and tris-8-hydroxyquinoline aluminum (Alq3).

When the intermediate layer 143 includes the polymer material, the intermediate layer 143 may have a structure including an HTL and an EML. In this case, the HTL may include poly(3,4-ethylenedioxythiophene):poly(4-styrene-sulfonate) (PEDOT:PSS), and the EML may include a polymer material, such as a poly-phenylenevinylene (PPV)-based material and a polyfluorene-based material.

The opposite electrode 145 may be disposed on the display area DA, covering the display area DA, as shown in FIG. 6. In an embodiment, the opposite electrode 145 may be continuously formed in a plurality of organic light emitting elements 140 and, thus, may overlap the plurality of pixel electrodes 141.

The organic light emitting element 140 may be easily susceptible to damage from external moisture or oxygen. The encapsulation layer 150 may cover and protect the organic light emitting element 140. The encapsulation layer 150 may cover the display area DA, and may extend to the outside of the display area DA. In an embodiment, the encapsulation layer 150 may include a first inorganic encapsulation layer 151, an organic encapsulation layer 153, and a second inorganic encapsulation layer 155.

The first inorganic encapsulation layer 151 may cover the opposite electrode 145. In an embodiment, the first inorganic encapsulation layer 151 may include silicon oxide, silicon nitride, or the like. Other layers such as a capping layer may be disposed between the first inorganic encapsulation layer 151 and the opposite electrode 145. The first inorganic encapsulation layer 151 is conformally formed on the opposite electrode 145, such that an upper surface of the first inorganic encapsulation layer 151 may not be flat. The organic encapsulation layer 153 may cover the first inorganic encapsulation layer 151. Unlike the upper surface of the first inorganic encapsulation layer 151, an upper surface of the organic encapsulation layer 153 may be flat. For example, the organic encapsulation layer 153 may have a flat upper surface at a portion corresponding to the display area DA. The organic encapsulation layer 153 may include an organic material. The second inorganic encapsulation layer 155 may be disposed on the organic encapsulating layer 153, covering the organic encapsulation layer 153. In an embodiment, the second inorganic encapsulation layer 155 may include silicon oxide, silicon nitride, or the like. In an embodiment, an edge of the second inorganic encapsulation layer 155 outside the display area DA may contact the first inorganic encapsulation layer 151 such that the organic encapsulation layer 153 is not exposed to the outside.

In an embodiment, the polarization plate 200 may be attached to the encapsulation layer 150 using an optically clear adhesive (OCA) 450. The optically clear adhesive 450 and the polarization plate 200 may cover at least a portion of the opening of the planarization layer 127.

The display device according to the present embodiment may include a first conductive layer 135c disposed on the inorganic insulation layer including the buffer layer 121, the gate insulation layer 123, and the insulation interlayer 125. The first conductive layer 135c may extend from the first flat area FA1 to the second flat area FA2 through the bending area BA. The first conductive layer 135c may serve as a wiring through which an electrical signal is transmitted to the display area DA. In an embodiment, the first conductive layer 135c may be formed concurrently (e.g., simultaneously) with the source electrode 135a or the drain electrode 135b by using the same material as a material of the source electrode 135a or the drain electrode 135b.

The display device according to the present embodiment may further include a second conductive layer 133b. The second conductive layer 133b may be disposed in the first flat area FA1. The second conductive layer 133b may be located at a different level from that of the first conductive layer 135c. The second conductive layer 133b may be electrically connected to the first conductive layer 135c.

In an embodiment, the second conductive layer 133b may be located at the same level as that of the gate electrode 133a of the thin film transistor 130. The first conductive layer 135c may contact the second conductive layer 133b located in the first flat area FA1 via a contact hole formed in the insulation interlayer 125.

The second conductive layer 133b may be electrically connected to a thin film transistor in the display area DA, and thus, the first conductive layer 135c may be electrically connected to the thin film transistor in the display area DA via the second conductive layer 133b.

The first conductive layer 135c that extends across the bending area BA may include a material having an elongation rate such that an occurrence of a crack in the first conductive layer 135c or a defect such as a disconnection in the first conductive layer 135c may be prevented or substantially prevented. In an embodiment, the second conductive layer 133b may include a material having a lower elongation rate than an elongation rate of the first conductive layer 135c and may have electrical/physical characteristics different from the electrical/physical characteristics of the first conductive layer 135c. Accordingly, efficiency of transmitting an electrical signal in the display device may be increased, or a defect rate during the manufacturing processes may be reduced. In an embodiment, the second conductive layer 133b may include for example, molybdenum, and the first conductive layer 135c may include, for example, aluminum.

A driving circuit chip 370 may be disposed on the second flat area FA2 of the display panel 100. The driving circuit chip 370 may be connected to the first conductive layer 135c and the second conductive layer 133b that are disposed on the second flat area FA2 and/or other conductive layers electrically connected to the first conductive layer 135c and the second conductive layer 133b. In an embodiment, the driving circuit chip 370 may be disposed on an end of the first conductive layer 135c. In some implementations, the driving circuit chip 370 may be connected to other conductive layers.

The bending protection layer 350 may be disposed on the bending area BA of the display panel 100. An end portion of the bending protection layer 350 located on the first flat area FA1 and may contact the polarization plate 200. In an embodiment, the bending protection layer 350 may be formed of substantially the same material as the material of the planarization layer 127, the pixel defining layer 129, and the organic encapsulation layer 153 of the encapsulation layer 150.

A protective film 550 may be disposed on a lower surface of the substrate 110. The protective film 550 may have an opening portion OP corresponding to the bending area BA of the display panel 100. An adhesive layer including a pressure sensitive adhesive (PSA), etc. for attaching the protective film 550 to the substrate 110 may be interposed between the substrate 110 and the protective film 550.

Hereinafter, a method of manufacturing a display device according to an embodiment will be described with reference to FIGS. 3, 4, 7 through 14.

FIGS. 7, 8, 9, 10, 11, 12, 13, and 14 are cross-sectional views or plan views illustrating stages of a method of manufacturing the display device according to an embodiment.

Figure 7:
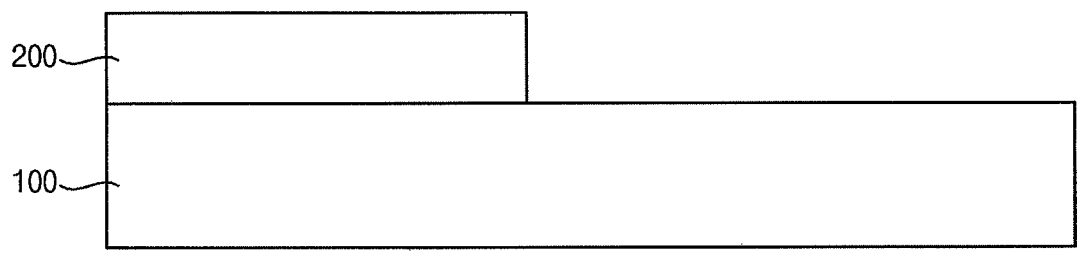
FIGS. 7, 8, 9, 10, 11, 12, 13, and 14 illustrate cross-sectional views or plan views of stages of a method of manufacturing the display device according to an embodiment.
Figure 8:
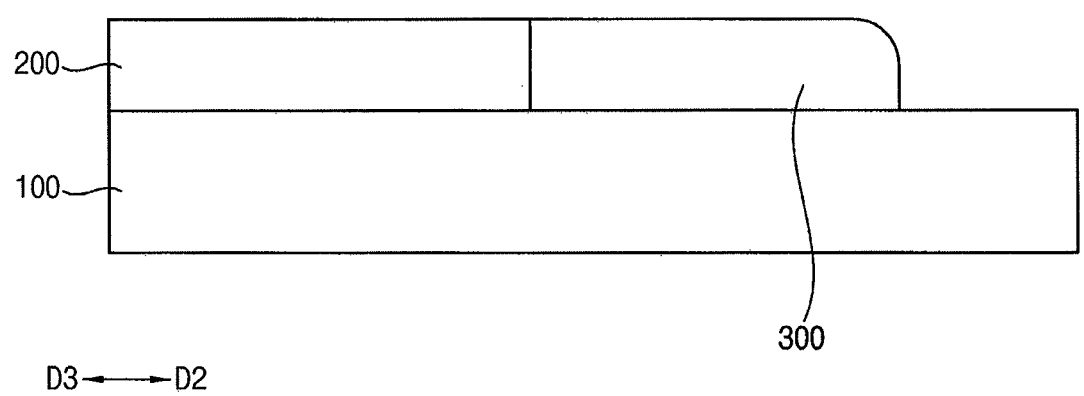
Figure 9:
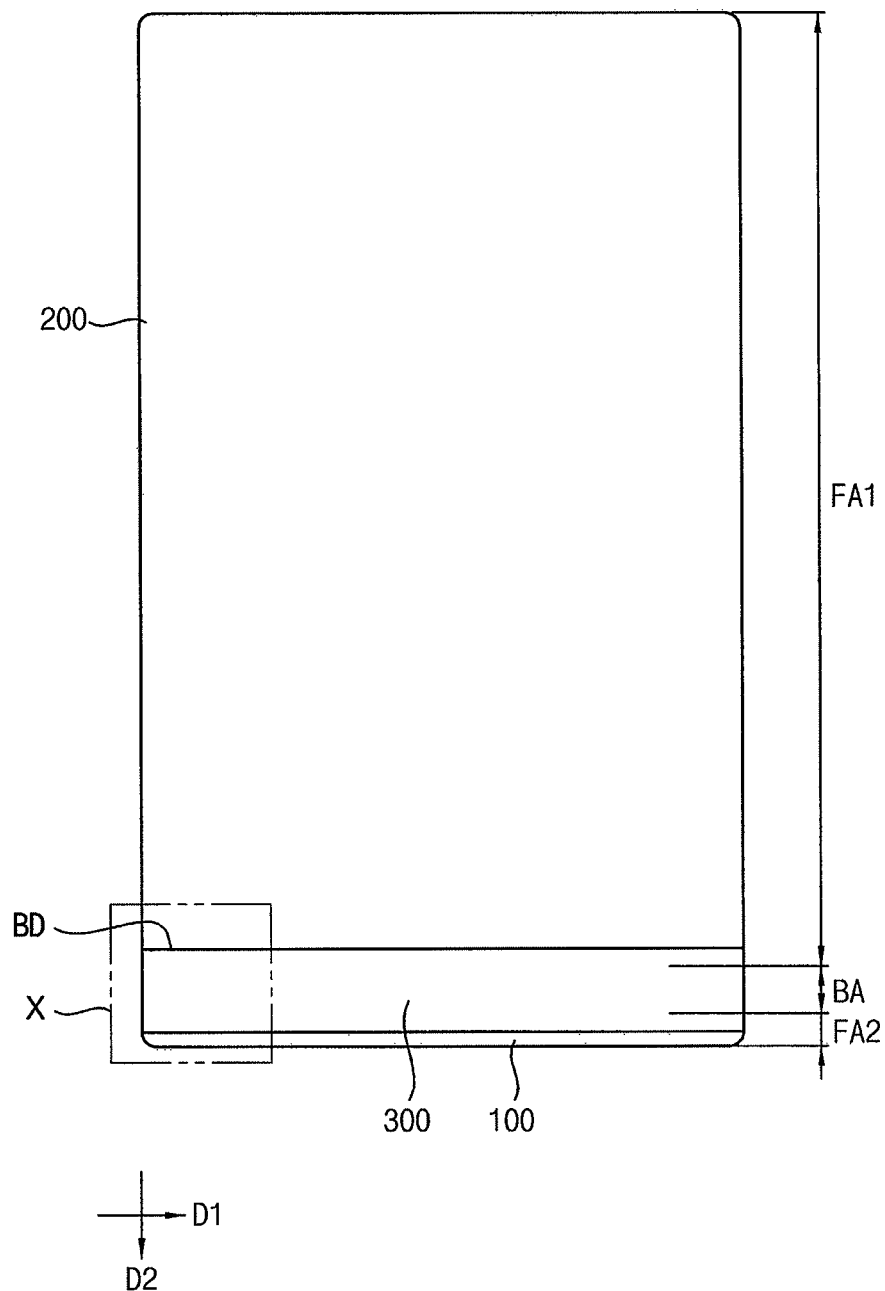

Referring to FIGS. 7, 8, and 9, the polarizing plate 200 may be attached to the display panel 100, and the organic layer 300 may be formed.

The polarizing plate 200 may be attached to the display panel 100. The polarizing plate 200 may be attached onto the first flat area FA1 of the display panel 100 including the display area DA. The polarizing plate 200 may be attached onto the display panel 100 by an optically clear adhesive.

The organic layer 300 may be formed on the display panel 100. The organic layer 300 may be formed to extend in the second direction D2 from the polarizing plate 200. The organic layer 300 may be formed on the bending area BA, a portion of the first flat area FA1 adjacent to the bending area BA, and a portion of the second flat area FA2 adjacent to the bending area BA. The organic layer 300 may contact the polarizing plate 200 on the first flat area FA1. Accordingly, a boundary BD between the polarizing plate 200 and the organic layer 300 may be formed. The boundary BD between the polarizing plate 200 and the organic layer 300 may be substantially parallel to the first direction D1. The organic layer 300 may be formed of, for example, an organic material such as polyimide, epoxy based resin, acrylate resin, polyester, photoresist, polyacryl based resin, polyimide based resin, polyamide based resin, siloxane based resin, etc.

Figure 10:
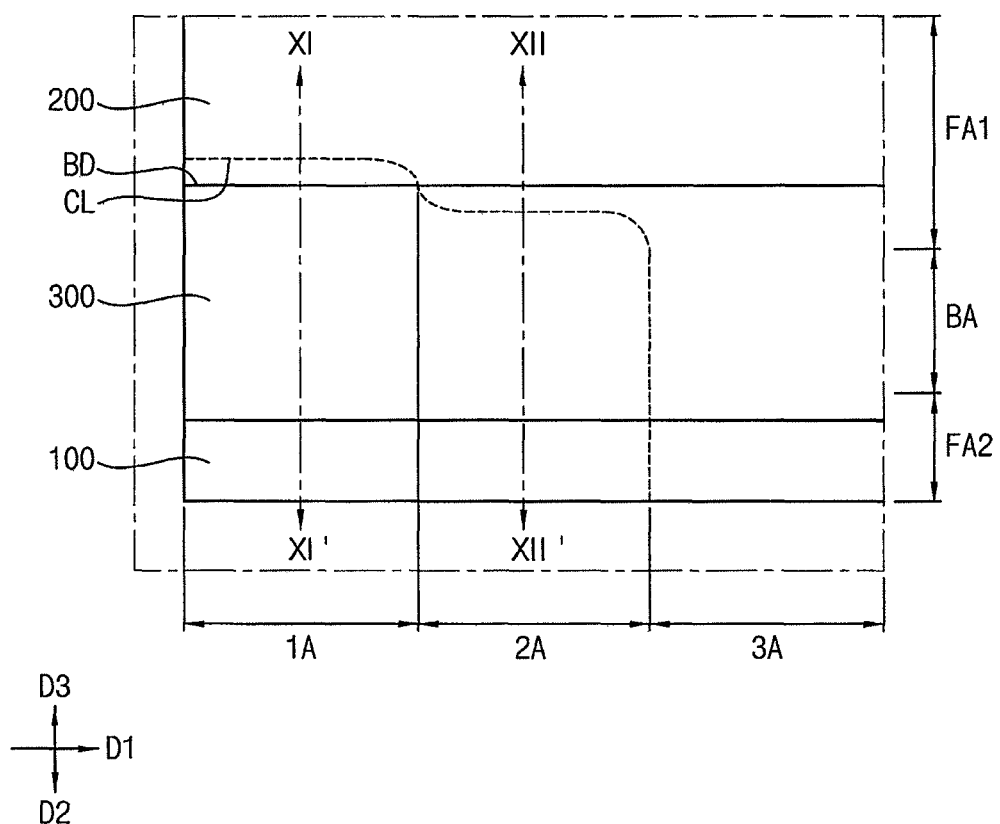
Figure 11:
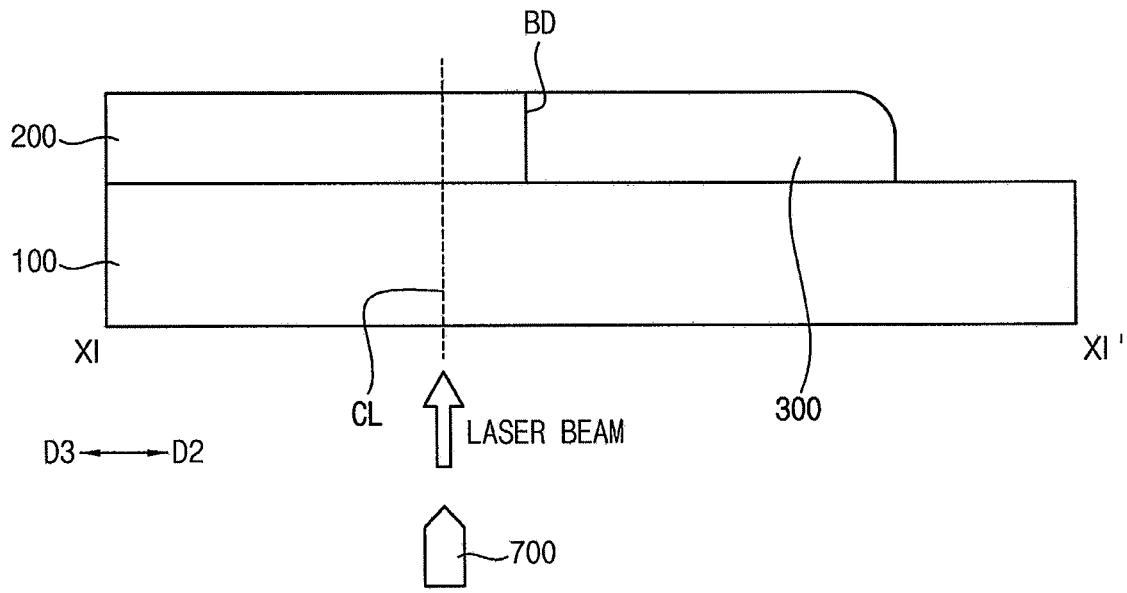
Figure 12:
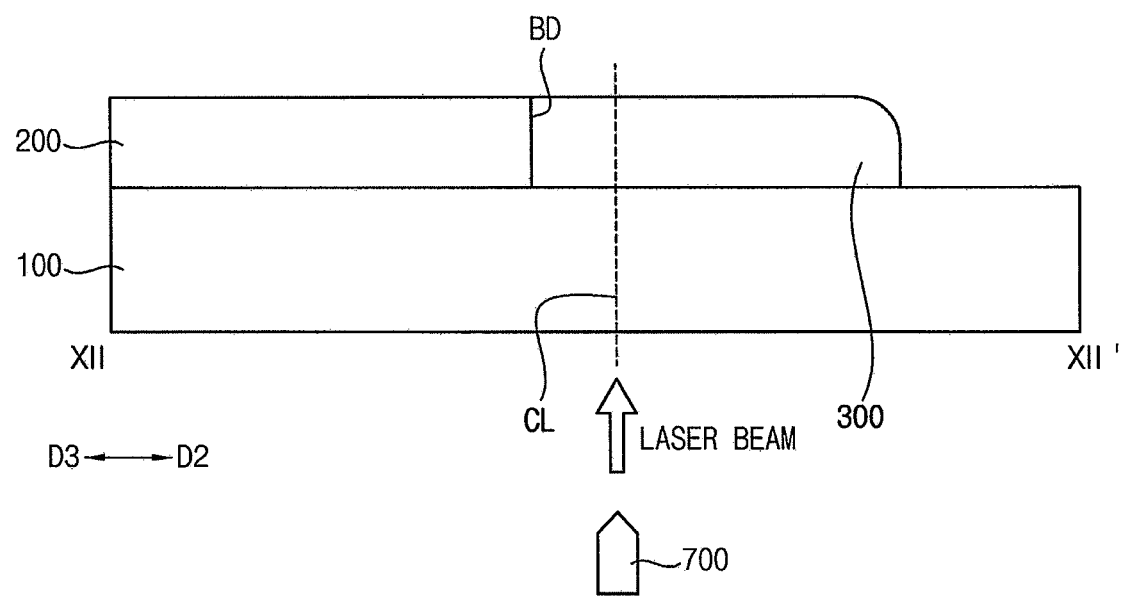
Figure 13:
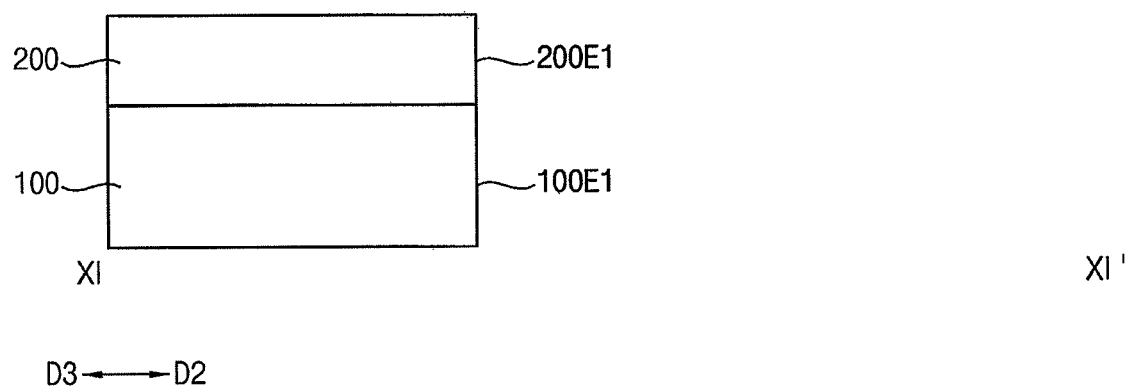
Figure 14:
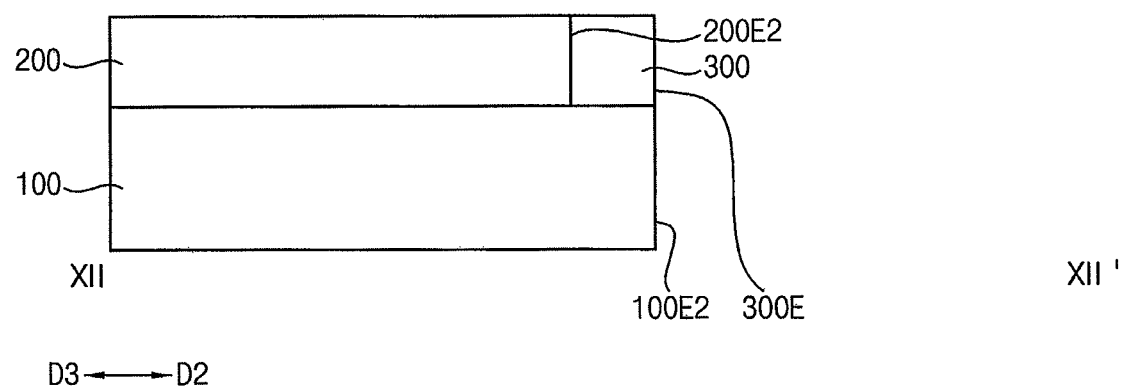

Referring to FIGS. 10, 11, 12, 13, and 14, the display panel 100 and the polarizing plate 200 may be simultaneously cut along a cutting line CL, and the display panel 100 and the organic layer 300 may be simultaneously cut. FIGS. 10 to 12 illustrate the display device before the display panel 100, the polarizing plate 200, and the organic layer 300 are cut, and FIGS. 13 and 14 illustrate the display device after cutting the display panel 100, the polarizing plate 200, and the organic layer 300.

The cutting line CL may be defined in the first area 1A and the second area 2A, and between the second area 2A and the third area 3A. The display panel 100 and the polarizing plate 200 may be simultaneously cut in the first area 1A along the cutting line CL. The display panel 100 and the organic layer 300 may be simultaneously cut in the second area 2A and between the second area 2A and the third area 3A along the cutting line CL.

The cutting line CL defined in the second area 2A may be located away from the cutting line CL defined in the first area 1A in the second direction D2. In an embodiment, the cutting line CL may extend along the first direction D1 in the first area 1A, may extend along a direction between the first direction D1 and the second direction D2 at a boundary between the first area 1A and the second area 2A, and may extend along the first direction D1 in the second area 2A.

In an embodiment, the cutting line CL defined in the first area 1A may be located away from the boundary BD between the polarizing plate 200 and the organic layer 300 in the third direction D3. The cutting line CL defined in the second area 2A may be located away from the boundary BD between the polarizing plate 200 and the organic layer 300 in the second direction D2. Accordingly, the cutting line CL may cross a point at which the boundary BD between the polarizing plate 200 and the organic layer 300 intersects the boundary between the first area 1A and the second area 2A.

In an embodiment, the display panel 100, the polarizing plate 200, and the organic layer 300 may be cut using a laser 700. A laser beam may be irradiated along the cutting line CL using the laser 700 such that the display panel 100 and the polarizing plate 200 may be simultaneously cut, and such that the display panel 100 and the organic layer 300 may be simultaneously cut.

The display panel 100 and the polarizing plate 200 may be simultaneously cut in the first area 1A such that the first end 100E1 of the display panel 100 formed at the cutting line CL may overlap the first end 200E1 of the polarizing plate 200 formed at the cutting line CL in a plan view.

In a comparative example, if the polarizing plate 200 were to be attached to the display panel 100 after cutting the polarizing plate 200 such that an end of the polarizing plate 200 overlaps an end of the display panel 100 in a plan view, the polarizing plate 200 could contract due to heat generated during a manufacturing process. Accordingly, the end of the polarizing plate 200 could move toward the third direction D3. Thereby, the end of the polarizing plate 200 not overlapping the end of the display panel 100 in a plan view, and an upper surface of the display panel 100 could be exposed. In this case, moisture could permeate into the upper surface of the display panel 100 exposed by the contract of the polarizing plate 200. However, according to the present embodiment, the display panel 100 and the polarizing plate 200 may be simultaneously cut after attaching the polarizing plate 200 to the display panel 100, therefore, the first end 100E1 of the display panel 100 may overlap the first end 200E1 of the polarizing plate 200 in the first area 1A.

The display panel 100 and the organic layer 300 may be simultaneously cut in the second area 2A such that the second end 100E2 of the display panel 100 formed at the cutting line CL may overlap the end 300E of the organic layer 300 formed at the cutting line CL in a plan view.

Referring to FIGS. 3 and 4, the transparent adhesive layer 400 may be attached onto the polarizing plate 200, the cover window 500 may be attached onto the transparent adhesive layer 400, and the watertight member 600 may be formed on the first end 100E1 of the display panel 100 and the first end 200E1 of the polarizing plate 200, after simultaneously cutting the display panel 100 and the polarizing plate 200 and simultaneously cutting the display panel 100 and the organic layer 300 along the cutting line CL. The watertight member 600 may contact the first end 100E1 of the display panel 100 and the first end 200E1 of the polarizing plate 200 that overlap with each other. Therefore, the watertight member 600 may seal the first end 100E1 of the display panel 100 and the first end 200E1 of the polarizing plate 200, thereby helping to prevent moisture from being permeated into the display panel 100.

By way of summation and review, an organic light emitting display device may include a display panel including an organic light emitting element in a display area. The organic light emitting display device is vulnerable to moisture, thus, preventing a degradation of the organic light emitting element due to moisture permeation may be needed. If the display panel is exposed, moisture may be permeated into the display panel through an exposed portion thereby degrading the organic light emitting element.

Embodiments provide a display device in which moisture permeation into a display panel is prevented.

Embodiments provide a method of manufacturing a display device for preventing moisture from being permeated into a display panel.

In the display device according to the embodiments, the end of the display panel and the end of the polarizing plate disposed on the display panel may be overlapped with each other in a plan view. Accordingly, moisture may not be permeated into the display panel.

In the method of manufacturing the display device according to the embodiments, the display panel and the polarizing plate may be simultaneously cut along the cutting line. Therefore, the end of the display panel and the end of the polarizing plate may be overlapped in a plan view, and moisture may not be permeated into the display panel The display device according to the embodiments may be applied to a display device included in a computer, a notebook, a mobile phone, a smartphone, a smart pad, a PMP, a PDA, an MP3 player, or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display device, comprising:
    a display panel including a first area and a second area, a first end of the display panel being in the first area and a second end of the display panel being in the second area, wherein the second area extends away from the first area in a first direction, and the second end of the display panel protrudes from the first end of the display panel in a second direction perpendicular to the first direction;
    a polarizing plate on the display panel, a first end of the polarizing plate being located in the first area overlapping the first end of the display panel in a plan view; and
    an organic layer on the display panel in the second area, the organic layer extending away from the polarizing plate in the second direction, an end of the organic layer overlapping the second end of the display panel in a plan view.

2. The display device as claimed in claim 1, wherein the organic layer contacts a second end of the polarizing plate located in the second area.

3. The display device as claimed in claim 2, wherein the second end of the polarizing plate protrudes in the second direction from the first end of the polarizing plate.

4. The display device as claimed in claim 1, wherein:
    the display panel further includes a third area extending in the first direction away from the second area, a third end of the display panel being in the third area, and
    the third end of the display panel protrudes in the second direction from the second end of the display panel.

5. The display device as claimed in claim 4, wherein a third end of the polarizing plate located in the third area is aligned in a plan view with a second end of the polarizing plate located in the second area.

6. The display device as claimed in claim 4, further comprising:
    a bending protection layer on the display panel in the third area, the bending protection layer extending in the second direction away from the polarizing plate.

7. The display device as claimed in claim 6, wherein the organic layer is integrally formed with the bending protection layer.

8. The display device as claimed in claim 1, further comprising:
    a watertight member contacting the first end of the display panel and the first end of the polarizing plate.

9. The display device as claimed in claim 8, further comprising:
    a transparent adhesive layer on the polarizing plate; and
    a cover window on the transparent adhesive layer.

10. The display device as claimed in claim 9, wherein the watertight member contacts an end of the transparent adhesive layer.

* * * * *